(12) United States Patent
Werker et al.

(10) Patent No.: US 7,586,335 B2
(45) Date of Patent: Sep. 8, 2009

(54) DIGITAL PHASE DETECTOR AND A METHOD FOR THE GENERATION OF A DIGITAL PHASE DETECTION SIGNAL

(75) Inventors: Heinz Werker, Huglfing (DE); Christian Ebner, München (DE)

(73) Assignee: National Semiconductor Germany AG, Unterhaching (DE)

( * ) Notice: Subject to any disclaimer, the term of this patent is extended or adjusted under 35 U.S.C. 154(b) by 0 days.

(21) Appl. No.: 11/773,810

(22) Filed: Jul. 5, 2007

(65) Prior Publication Data
US 2008/0013665 A1  Jan. 17, 2008

(30) Foreign Application Priority Data
Jul. 6, 2006  (DE) ........................ 10 2006 031 331

(51) Int. Cl.
*G01R 25/00* (2006.01)
*H03D 13/00* (2006.01)
(52) U.S. Cl. ..................................... 327/9; 327/3; 327/7
(58) Field of Classification Search ................ 327/1–12
See application file for complete search history.

(56) References Cited
U.S. PATENT DOCUMENTS
7,256,627 B1 * 8/2007 Talbot et al. ................. 327/141
2004/0091073 A1 * 5/2004 Smith et al. ................... 375/355

FOREIGN PATENT DOCUMENTS
DE         10308921 A1    9/2004

OTHER PUBLICATIONS

Urbansky, R.; Sturm, W.; "A Novel Slave-Clock Implementation Approach for Telecommunications Network Synchronisation", European Frequency Time Forum, IEE, Mar. 1996, Conference Publication No. 418, pp. 534-539.

* cited by examiner

*Primary Examiner*—Lincoln Donovan
*Assistant Examiner*—Daniel Rojas
(74) *Attorney, Agent, or Firm*—Pearne & Gordon LLP

(57) ABSTRACT

The present invention concerns a digital phase detector (PD) and also a method for digital phase detection, as can in particular be used e.g. in a so-called phase locked loop (PLL). According to the invention a digital phase detection signal (PD_OUT) is obtained, which specifies the phasing of an input clock signal (PD_IN) with reference to a higher frequency sampling clock signal (CK). In order hereby to overcome the limitation of the phase resolution as a result of a limited performance capability, in particular limited speed of the electronic components of a sampling device (14), a new kind of concept is used, in which the sampling clock signal (CK) is not immediately used for sampling (14), but is subjected beforehand to a digitally adjustable phase displacement (12). There originates an "auxiliary sampling clock signal" (CK<1:8>). The sampling (14) delivers a first, more significant digital component (OUT1<9:0>) of the phase detection signal (PD_OUT). Based on an evaluation of this first digital component (OUT1<9:0>) a phase displacement (12) is undertaken and a second digital component (OUT2<12:0>) of the phase detection signal (PD_OUT) is generated. The auxiliary sampling clock signal (CK<1:8>) is here adjustable in steps, which in each case are smaller than one period of the sampling clock signal (CK).

10 Claims, 6 Drawing Sheets

Figure 1:
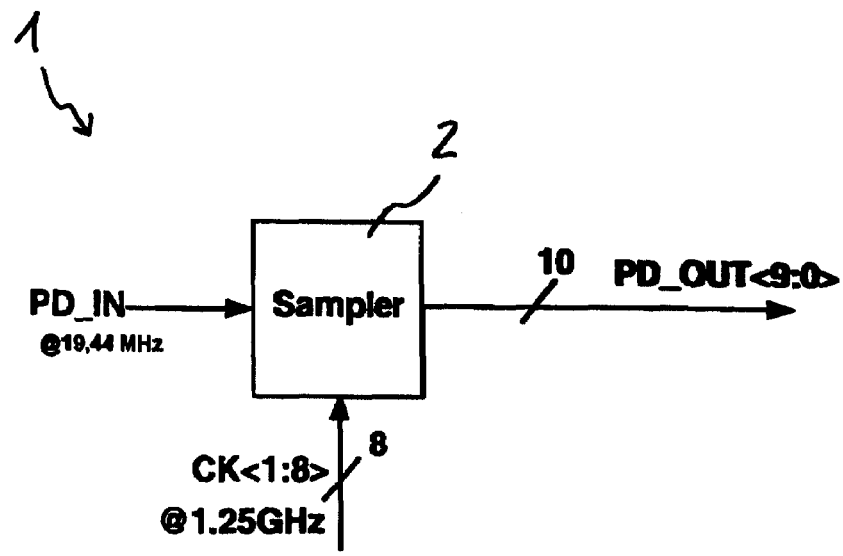

DIGITAL PHASE DETECTOR AND A METHOD FOR THE GENERATION OF A DIGITAL PHASE DETECTION SIGNAL

BACKGROUND OF THE INVENTION

1. Field of the Invention

The present invention concerns a digital phase detector and also a method for digital phase detection, as can in particular be used e.g. in a so-called phase locked loop (PLL).

In general terms a PLL serves the purpose of synchronising a controllable oscillator, which generates an output signal with an output frequency, with an input clock signal with an input frequency, by means of feedback. For this purpose the PLL comprises a phase detector or phase comparator, at whose input the input clock signal and the PLL output signal are present. A signal representing the respective phasing between these two signals is mainly used to control the oscillator via an active or passive, digital or analog filter ("loop filter").

2. Description of the Prior Art

The areas of application for PLL circuits are many and varied. For example PLLs can be used for clock signal recovery from digital signal sequences, or for FM demodulation. In communications standards such as "SONET" or "SDH" clock generation circuits are required to generate clock signals during the transmission and receipt of data. In a circuit of this kind a PLL circuit can generate, e.g. from an input clock signal inputted as a reference, one or a plurality of output clock signals for use in a communications system.

In accordance with prior art based on knowledge within the business organisation of the applicant an approach for the implementation of a digital phase detector consists in combining an analog phase detector with a downstream analog-digital converter. The phase resolution thus achievable is however severely limited by the linearity of the analog phase detector and also the resolution of the analog-digital converter. Therefore in accordance with another approach a digital phase detector has been implemented with a sampling circuit in which an input clock signal supplied to the phase detector is sampled by means of a higher frequency sampling clock signal, likewise supplied to the phase detector ("over-sampling"). The phase resolution is then definitively determined by the sampling rate (frequency of the sampling clock signal), wherein, however, the maximum sampling frequency is limited in practice by the speed of the electronic components used in the sampling circuit.

SUMMARY OF THE INVENTION

It is an object of the present invention to provide a phase detection by means of which the phasing of an input clock signal can be detected with reference to a sampling clock signal with high phase resolution.

This object is achieved by means of a digital phase detector for the generation of a digital phase detection signal that specifies the phasing of an input clock signal supplied to the phase detector with reference to a higher frequency sampling clock signal supplied to the phase detector, comprising:

a digitally adjustable phase displacement device for the generation of an auxiliary sampling clock signal as a digitally adjusted phase displaced version of the sampling clock signal, wherein the auxiliary sampling clock signal is adjustable in steps, which in each case are smaller than one period of the sampling clock signal, a sampling device for the sampling of the input clock signal with the auxiliary sampling clock signal, in order to generate a first, more significant digital component of the phase detection signal, an evaluation device for the evaluation of the first digital component and for the generation of a digital control signal on the basis of the evaluation result, by means of which the adjustable phase displacement device is adjusted, and a second digital component of the phase detection signal is generated.

The above object is further achieved by means of a method for the generation of a digital phase detection signal that specifies the phasing of an input clock signal with reference to a high frequency sampling clock signal, comprising the steps:

generation of an auxiliary sampling clock signal as a digitally adjusted, phase displaced version of the sampling clock signal, wherein the auxiliary sampling clock signal is adjustable in steps, each of which is smaller than one period of the sampling clock signal, sampling of the input clock signal with the auxiliary sampling clock signal, in order to generate a first, more significant digital component of the phase detection signal, evaluation of the first digital component and generation of a digital control signal on the basis of the evaluation result, by means of which the adjustable phase displacement provided by the generation of the auxiliary sampling clock signal is adjusted, and a second digital component of the phase detection signal is generated.

Advantageous further developments of the invention are also described below and can be provided as such, or in combination.

The invention is based on the approach referred to above of a sampling of the input clock signal by means of a higher frequency sampling clock signal, in order to obtain a digital phase detection signal that specifies the phasing of an input clock signal with reference to the sampling clock signal.

Here, however, in order to overcome the limitation of the phase resolution as a result of limited performance capability, in particular the limited speed of the electronic components of the sampling device, a new kind of extension of the conventional concept is used in which the sampling clock signal is not directly drawn on for the sampling, but is subjected beforehand to a digitally adjustable phase displacement. The sampling by means of the "auxiliary sampling signal" delivers a first, more significant digital component of the phase detection signal. Based on an evaluation of this first digital component a small phase displacement is undertaken that is relevant for the next sampling. At the same time a second digital component of the phase detection signal is generated, based on this evaluation.

In the invention the phase resolution is finally determined by the resolution of the phase displacement device, which is adjustable in steps. This resolution can in practice be envisaged to be significantly higher than the resolution of the sampling device, so that with the invention the resolution of the phase detection can be considerably increased.

A preferred use of the phase detector and/or the phase detection method ensues with the implementation of the phase detector in a PLL. In this application the increased phase resolution of the phase detector can advantageously be used to improve the performance characteristics of the PLL concerned.

In a particularly preferred form of embodiment the evaluation of the first digital component of the phase detection signal consists in a simple comparison of this first digital component with a prescribed threshold value. In this case the evaluation delivers information as to whether the first digital component is larger or smaller than the e.g. fixed prescribed threshold value. Based on this information, which in what follows is also denoted as the "sign" of the first digital component, the auxiliary sampling clock signal can then be adjusted with regard to its phase, before the next evaluation, e.g. the next comparison, takes place. In the invention therefore a fixed sampling clock signal is not used in a conventional manner for sampling, but instead a variable auxiliary sampling clock signal, generated by an adjustable phase displacement. In the evaluation of the first, more significant digital component moreover a second component of the phase detection signal is generated, alterable in relatively small (less significant) steps, which in the invention represents the additionally achieved phase resolution of the phase detection.

The digital control signal generated in the evaluation of the first digital component for the adjustment of the phase displacement is effectively a "correction signal", by means of which the phasing of the auxiliary sampling clock signal is adjusted with reference to the sampling clock signal in small steps. The magnitude of the adjustment delivers "fine information" that is used to form or alter the second component of the phase detection signal in the phase detector, adjusted in less significant steps.

In the sampling of an input clock signal with a higher frequency sampling clock signal, e.g. the auxiliary sampling clock signal extracted therefrom, a sampling device can be implemented, e.g. by means of flip-flops, in particular flank-controlled flip-flops, at whose output a digital representation of the phasing is obtained. The practical problem here is the sample-and-hold time necessary for each flip-flop, which thus limits the time-wise resolution of the sampling that can be achieved. This limitation also applies if the sampling clock signal (or the auxiliary sampling clock signal) is provided with a plurality of sampling phases in order to improve the resolution of the sampling from the outset ("multiphase sampling"). For the considerable improvement of the phase resolution achievable with the invention it is critical that the resolution of the phase detection is in the final instance based on the resolution of a phase displacement (of the auxiliary sampling clock signal with reference to the supplied sampling clock signal), which in practice is not subject to any significant limitations. In one form of embodiment, particularly preferred because of its simple implementation in terms of circuitry and accuracy, the digitally adjustable phase displacement is implemented by means of a digitally adjustable phase interpolation, in which, starting from a sampling clock signal with a plurality of phases, an auxiliary sampling clock signal is generated which is interpolated between these phases. For this phase interpolation recourse can advantageously be made to circuitry concepts known per se for the implementation of a phase interpolator (e.g. the weighted addition of two or more input phases for the generation of an interpolated output phase).

In a form of embodiment provision is made that the frequency of the sampling clock signal is greater than the frequency anticipated for the input clock signal by at least a factor $10^1$, preferably by at least a factor $10^2$. The sampling clock signal can e.g. be a periodic signal with a fixed prescribed period.

In a form of embodiment provision is made that the auxiliary sampling clock signal is provided with a plurality of phases in order to increase the phase resolution in the generation of the first digital component. In this case a "multiphase sampling" is used to form the first digital component. Here provision can be made that the plurality of auxiliary sampling clock signal phases are equidistant from one another. The individual auxiliary sampling clock signal phases then possess the period of the supplied sampling signal, but are phase displaced from one another. In a preferred form of embodiment provision is made that each adjustment step of the phase displacement corresponds to a whole number fraction of the phase difference between auxiliary sampling clock signal phases that are adjacent to one another.

As has already been elucidated further above, the phase displacement necessary for the invention can be implemented in a particularly simple manner as phase interpolation. In a form of embodiment provision is made that the sampling clock signal is provided with a plurality of sampling phases and the phase displacement device is designed as a phase interpolator for the digitally adjustable interpolation between the sampling phases. In one simple embodiment the sampling clock signal is provided with two sampling phases with a mutual phase offset of 90°, in other words as so-called "quadrature signals".

In a preferred form of embodiment provision is made that the adjustment of the phase displacement is prescribed by an output signal of a modulo-integrator, to which is inputted the digital control signal generated by the evaluation device.

In a form of embodiment provision is made that the evaluation device comprises a sign detector to determine a sign of the first digital component. The term "sign" is here to be understood very broadly, and should also comprise the case in which this sign is representative of the exceedance of, or the failure to attain, a prescribed threshold value, which differs from zero. Part of the circuitry of the evaluation device that serves to generate the second digital component of the phase detection signal can here be designed in a simple manner as an integrator (counter), which integrates the sign information (+1 or −1) determined from a sign detector.

SHORT DESCRIPTION OF THE DRAWINGS

In what follows the invention is further described with the aid of an example of embodiment with reference to the accompanying drawings. In the figures:

FIG. 1 shows a representation demonstrating the function of a conventional phase detector with a phase resolution of for example 100 ps.

Figure 2:
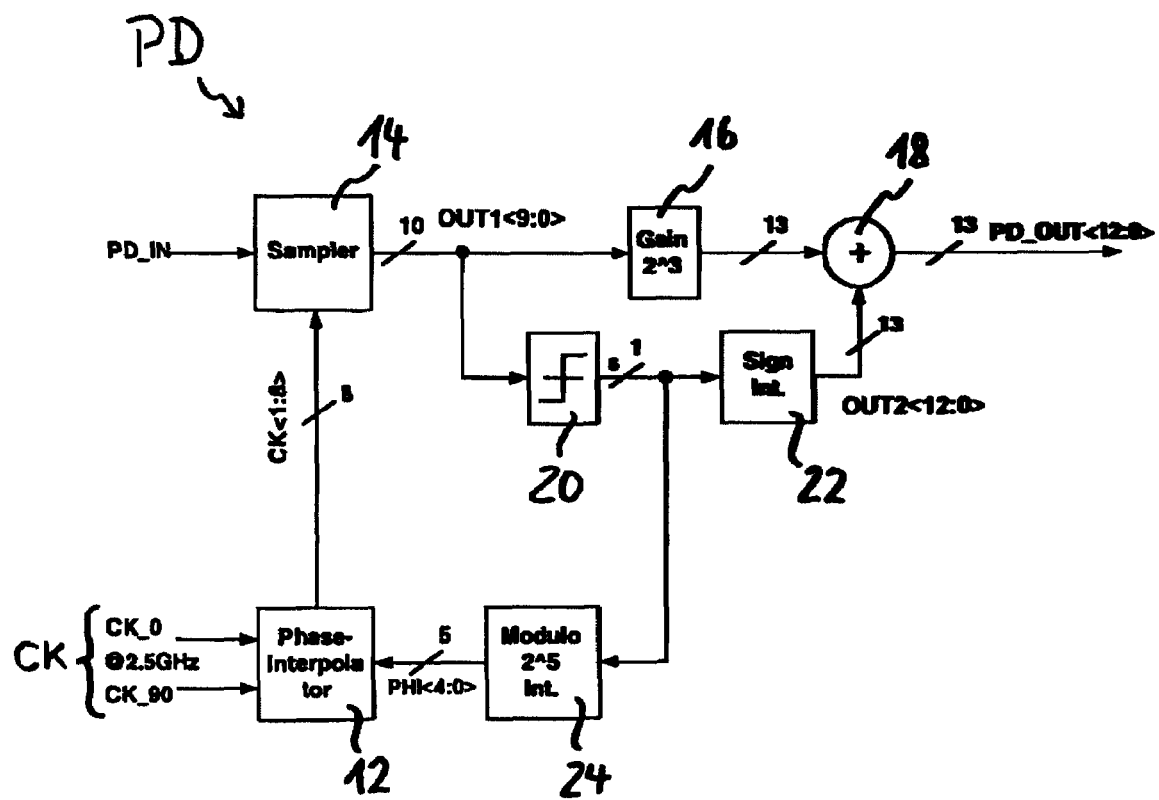
Figure 3:
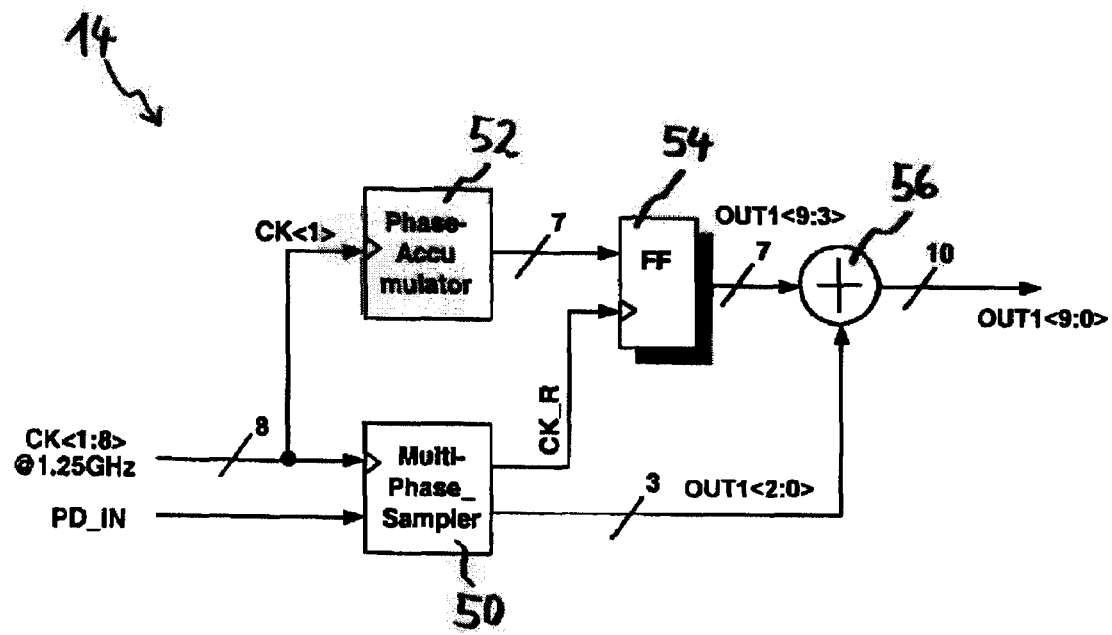
Figure 4:
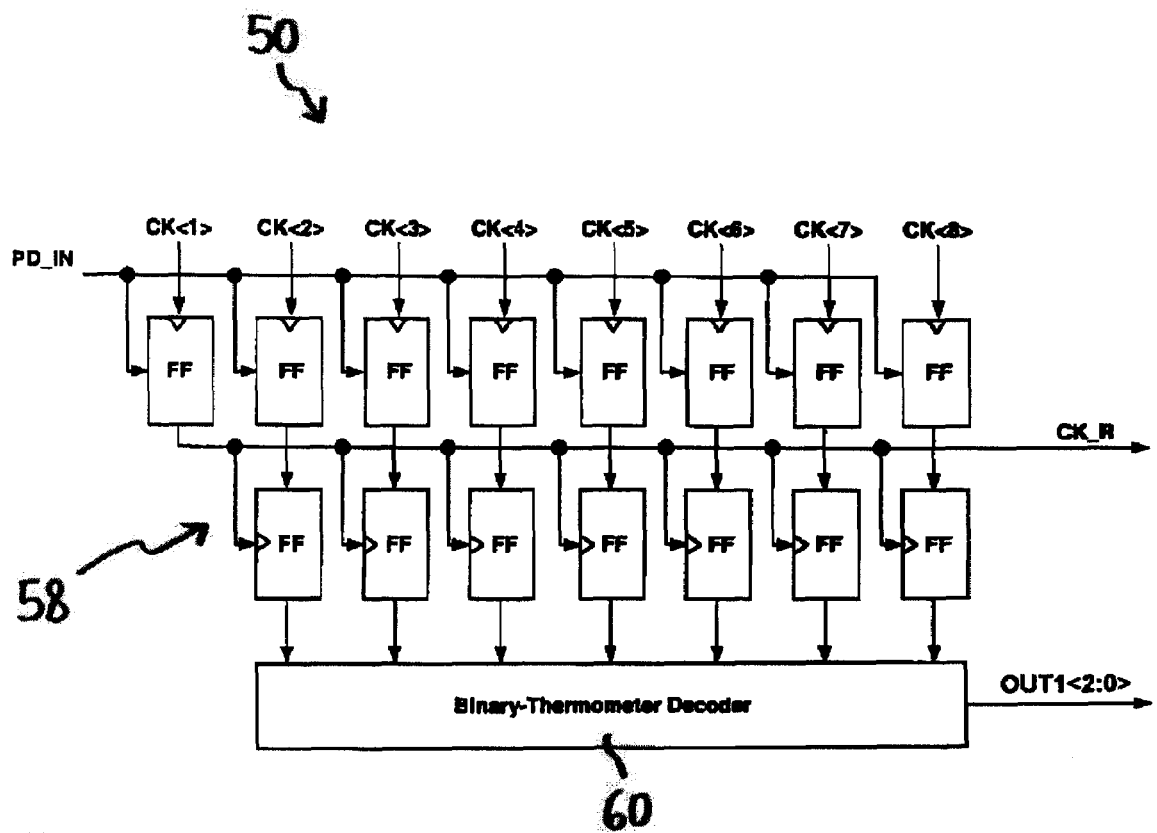
Figure 5:
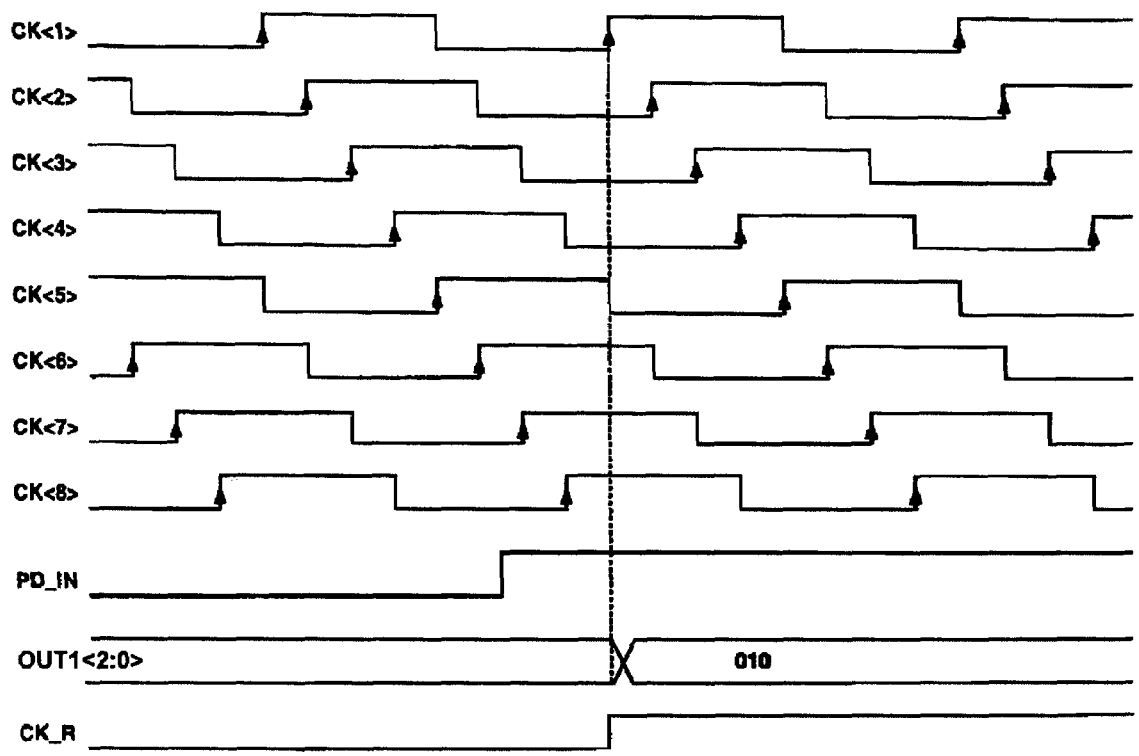
Figure 6:
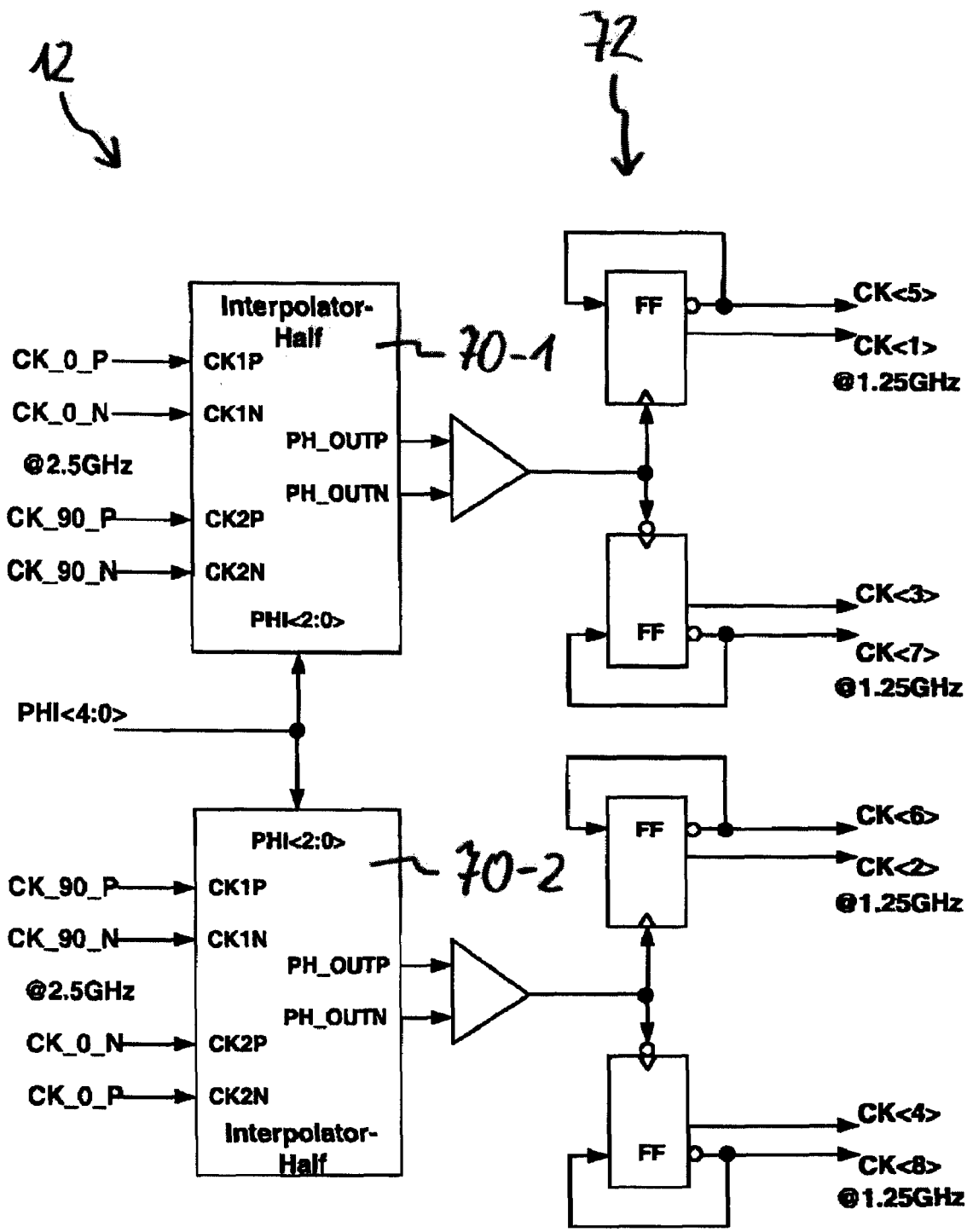
Figure 7:
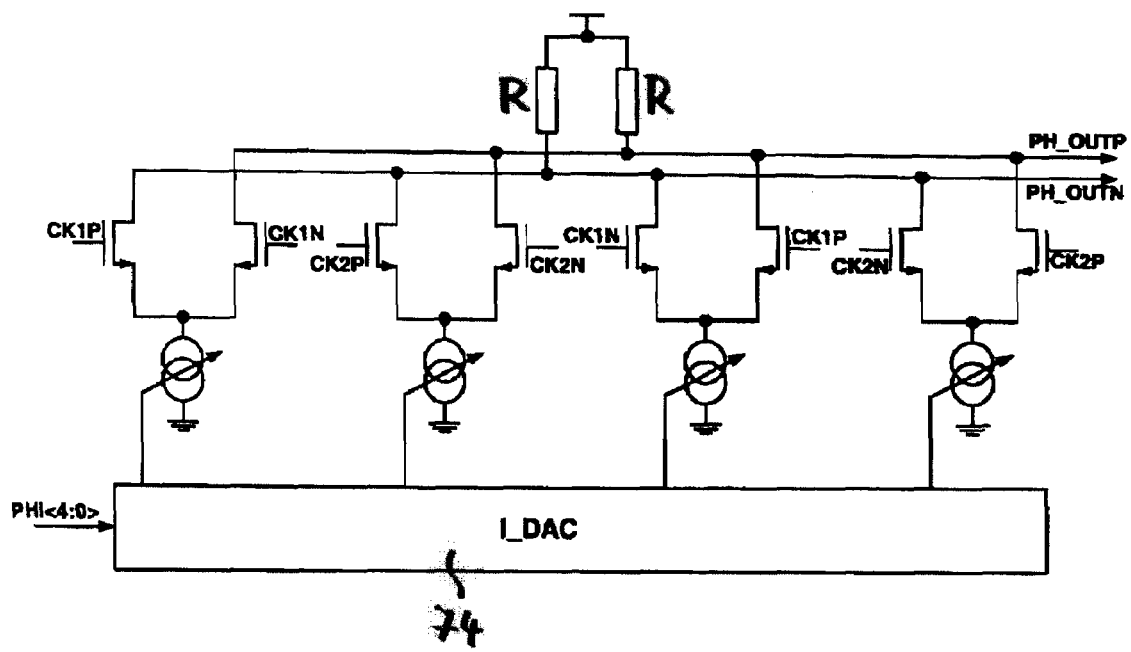
Figure 8:
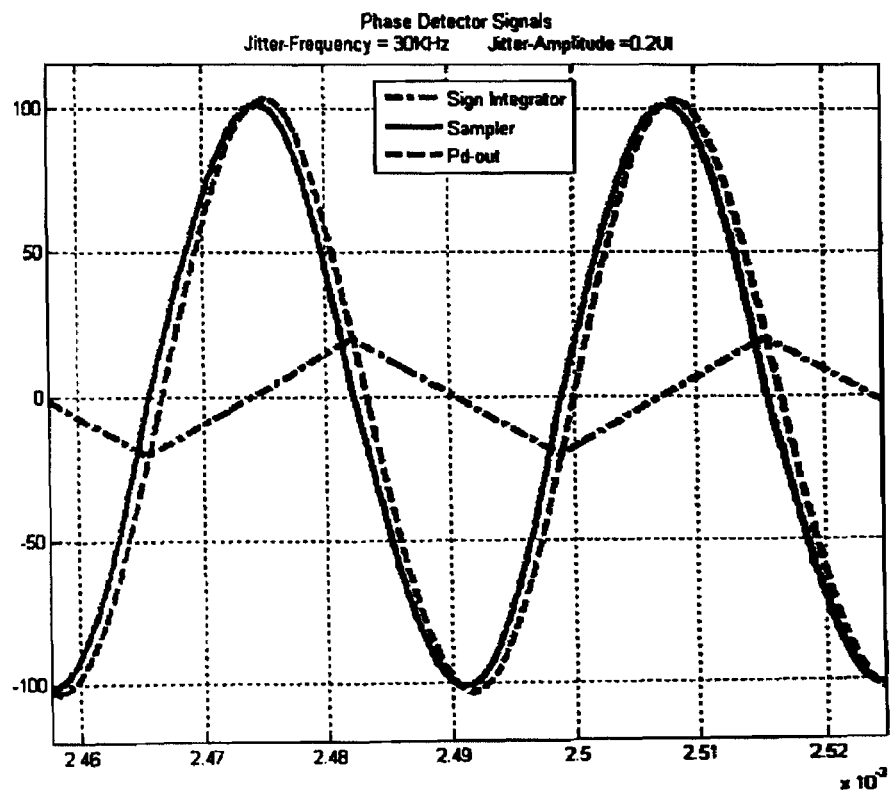
Figure 9:
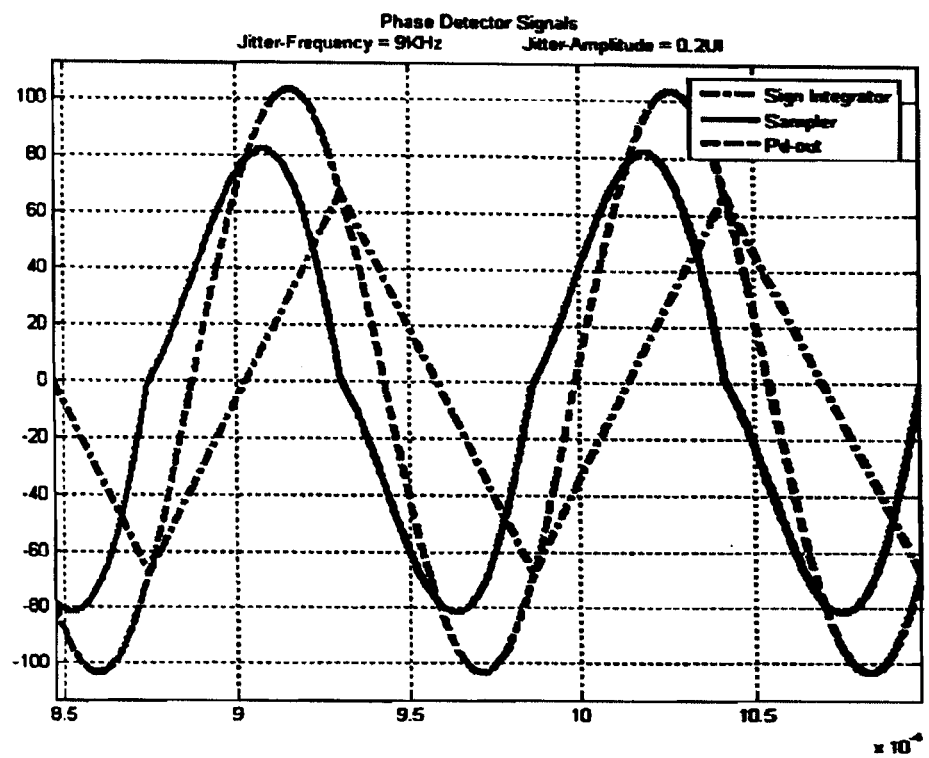
Figure 10:
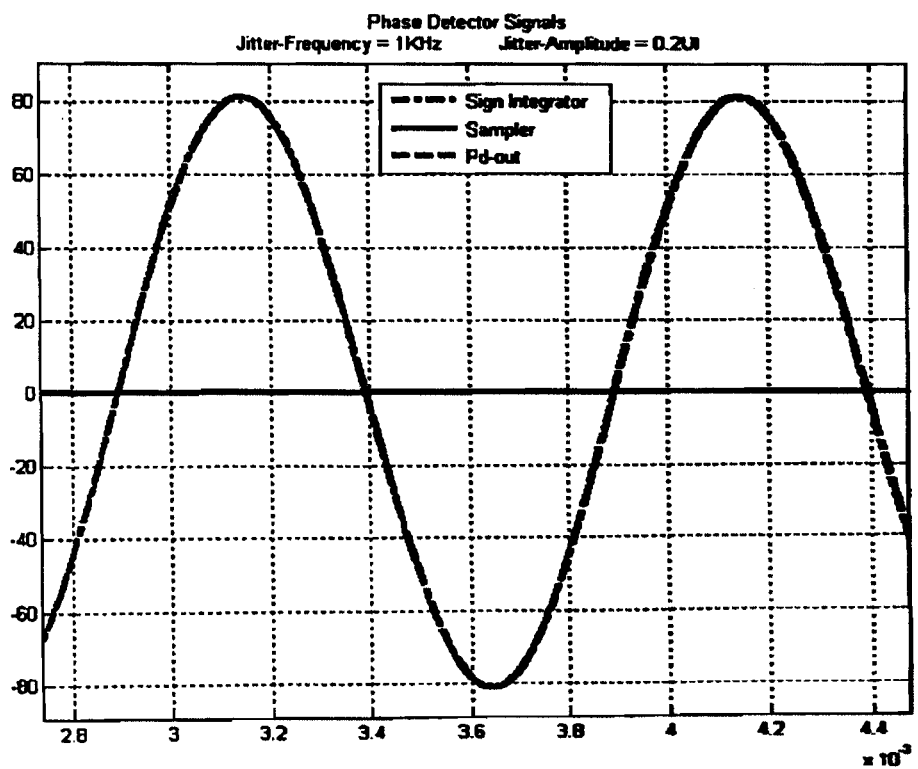

FIG. 2 shows the structure of a phase detector according to the invention with a phase resolution of, for example, 12.5 ps, FIG. 3 shows the structure of a sampling device used in the phase detector of FIG. 2, FIG. 4 shows the structure of a multiphase sampler used in the sampling device of FIG. 3, FIG. 5 shows an exemplary representation of the time profiles of signals that occur at the multiphase sampler of FIG. 4, FIG. 6 shows the structure of a phase interpolator used in the phase detector of FIG. 2, FIG. 7 shows the structure of two interpolator halves used in the phase interpolator of FIG. 6, FIG. 8 shows a simulation result for some signals occurring at the phase detector of FIG. 2 for a certain jitter frequency in the input clock signal, FIG. 9 shows a corresponding simulation result for a reduced jitter frequency, and FIG. 10 shows a corresponding simulation result for an even further reduced jitter frequency.

DESCRIPTION OF THE PREFERRED EMBODIMENT(S)

FIG. 1 demonstrates the function of a conventional digital phase detector 1 generating a digital phase detection signal PD_OUT, which specifies the phasing of an input clock signal PD_IN supplied to the phase detector 1 with reference to a higher frequency sampling clock signal CK supplied to the phase detector 1. The anticipated, or average, frequencies of the signals PD_IN and CK are specified in FIG. 1 in an exemplary manner, and in this example differ from each other by a factor of approximately 64. The phase detector 1 consists of a sampling device 2, which generates the phase detection signal PD_OUT in a binary representation. If a single phase sampling signal CK were to be used one here, then, in accordance with the selected "oversampling", a signal PD_OUT with a resolution of 6 bits could be provided ($2^6$=64). In the example represented the sampling clock signal CK is however inputted with eight phases arranged equidistant to one another, which in FIG. 1 is symbolised by the notation "CK<1:8>", and this enables a corresponding increase in the resolution of the outputted phase detection signal PD_OUT by a factor 8. In the example represented the phase detection signal PD_OUT is outputted with a resolution of 10 bits (symbolised by the notation "PD_OUT<9:0>").

In other words the sampling device 2 is designed as a so-called "multiphase sampler", by means of which the supplied input clock signal PD_IN is simultaneously compared with a plurality of phases of the also supplied higher frequency sampling clock signal CK in order to extract the phase information PD_OUT.

For many applications a further increase in accuracy i.e. phase resolution of the phase detection result PD_OUT would be desirable. In the current circuitry implementations of the sampling device 2 represented in FIG. 1, however, one quickly comes up against technical limits, which are conditioned by the performance characteristics of the electronic components used. Thus from a practical point of view no increase in the resolution in the signal PD_OUT can be achieved, either by increasing the sampling frequency or by increasing the number of phases of this sampling signal that are simultaneously used.

In what follows an example of embodiment of the invention is described with reference to FIGS. 2 to 7, by means of which the elucidated limitation of phase resolution is overcome. It should be noted at this point that a sampling device of the kind represented in FIG. 1 is also used in the phase detector according to the invention. FIG. 3 shows the structure of such a sampling device. In the invention, however, such a sampling device is supplemented by further components, so that the phase resolution of the phase detection achieved is no longer limited by the resolution capability of the sampling device.

FIG. 2 shows the structure of a phase detector PD generating a digital phase detection signal PD_OUT<12:0>, in other words with a very high resolution of 13 bits, which specifies the phasing of an input clock signal PD_IN supplied to the phase detector PD with reference to a higher frequency sampling clock signal CK supplied to the phase detector. The sampling clock signal CK with two sampling phases CK_0 and CK_90, displaced by 90° from one another, is supplied to a phase interpolator 12.

The phase interpolator 12 is digitally adjustable by means of a digital signal PHI<4:0> (in other words with 5 bit resolution) and generates as a digitally adjusted phase displaced version of the sampling clock signal CK a signal denoted in what follows as an "auxiliary sampling clock signal" CK<1:8>, which in the example of embodiment represented is thus provided with 8 phases for a sampling device 14, to which the input clock signal PD_IN is also supplied.

As far as the structure of the sampling device 14 is concerned, recourse can advantageously be made to any circuitry concepts known per se. The structure of the represented sampling device 14 is described in detail below with reference to FIGS. 3 to 7, but is of secondary importance for the functionality of the device. What is fundamental for the invention is rather the interaction of the sampling device, here in an exemplary manner represented as a multiphase sampling device, with other detector components, as these are represented in an exemplary manner in FIG. 2.

The sampling device 14 samples the input clock signal PD_IN with the auxiliary sampling clock signal CK<1:8>, in order to generate, as represented in FIG. 2, a first higher order digital component OUT1<9:0> of the phase detection signal PD_OUT<12:0>, which via a digital amplifier (multiplier) 16 is entered, increased by a factor 8, into an adder 18, to which moreover a second digital component OUT2<12:0> is inputted, in order to generate the desired phase detection signal PD OUT<12:0>, by an addition of the inputted signal components OUT1 and OUT2.

In what follows is described the manner in which the second digital component OUT2<12:0>, alterable in less significant steps, is generated, by means of which the phase resolution of the overall arrangement is considerably increased.

As can be seen from FIG. 2, the first digital component OUT1<9:0> is inputted to a sign detector 20, which compares this digital component with a fixed prescribed threshold value (effectively a suitably defined "zero point", e.g. in the example the value "64"), and outputs in digital form ("+1" or "−1") sign information corresponding to the comparison result s.

The sign information s is inputted on the one hand to a sign integrator (counter) 22 and on the other hand to a modulo-32 integrator (cyclic counter) 24.

The output value of the modulo-32 integrator 24 is the control signal PHI<4:0>, to which reference has already been made above, and by means of which the phase shift of the auxiliary sampling clock signal, effected by the phase interpolator 12, is adjusted with reference to the inputted sampling clock signal. Depending upon the result of the last phase comparison, i.e. the sign information s resulting from this, the auxiliary sampling clock signal, or more accurately stated, the eight individual phases CK<1>, CK<2>, . . . is therefore correspondingly phase displaced by the phase interpolator 12 before the next phase comparison is made by the sampling device 14. The digital sign integrator 22 registers (counts) the magnitude of the phase adjustments and thus delivers the additional phase information (second digital component of the phase detection signal) of the phase detector PD.

FIG. 3 shows the structure of the sampling device 14 used in the phase detector PD of FIG. 2.

The phase-displaced version CK<1:8> of the sampling signal CK and also the phase detector input signal PD_IN are inputted into a multiphase sampler 50, which from these generates signals CK_R and OUT1<2:0>. One signal component CK<1> of the signal CK<1:8>, which in total consists of eight signal components CK<1> to CK<8>, is also inputted to a phase accumulator 52 (counter). A signal outputted from the phase accumulator 52, and also the signal CK_R are, as represented, applied to a flip-flop arrangement 54 consisting of seven flip-flops; the latter forms a signal component OUT1<9:3>, which fed via a summation element 56 to which the signal OUT1<2:0> is also applied, forms the phase detector output signal OUT1<9:0>. In the example of embodiment represented the sampling device 14 generates at its output a 10-bit word, which represents the phasing of the signals supplied to the phase detector PD in a digital manner. The sampling device 14 comprises the multiphase sampler working at high speed to provide the signal OUT1<2:0>, which represents the 3 bits of lowest order of the phase detector output signal OUT1<9:0>. The flip-flop arrangement 54 generates the 7 higher order bits. The multiphase sampler samples the supplied phase detector input signal PD_IN, which in the example represented has a frequency of 19.44 MHz, with the 8 evenly spaced clock signals CK<1> to CK<8>, which in the example of embodiment represented possess a frequency of 1.25 GHz and deliver a phase resolution of 100 ps.

FIG. 4 shows the structure of the multiphase sampler 50 represented in FIG. 3.

The multiphase sampler 50 contains, as represented, a flip-flop arrangement 58 and also a decoder 60, to which are applied the signals PD_IN and CK<1> to CK<8> in the manner represented, and on the output side outputs the signals CK_R and OUT1<2:0>.

FIG. 5 shows exemplary time profiles of the signal components CK<1> to CK<8>, the signal PD_IN, the signal OUT1<2:0> and the signal CK_R. FIG. 5 shows in particular the phase relationship between the 8 sampling clock signals CK<1:8> and the phase detector input signal PD_IN and the phase detector output signal OUT1.

From this it can be seen that the signal components CK<1> to CK<8> generated by the phase interpolator 12 are identical signals that are, however, equidistantly displaced in phase from one another. In the example of embodiment represented the time-wise displacement between two of these signal components that are adjacent (e.g. between CK<1> and CK<2>) corresponds to 100 ps.

FIGS. 6 and 7 clarify the structure of the phase interpolator 12.

The overall structure of the interpolator 12 is shown in FIG. 6. In order to provide the eight evenly spaced (by 100 ps) clock signals CK<1> to CK<8> at a frequency of 1.25 GHz, the interpolator 12 comprises the two represented interpolator halves 70-1 and 70-2, and an output section 72 of the circuit with additional divider circuits. The interpolator halves 70-1 70-2 and the interpolator output section 72 of the circuit act together in the manner represented to form from the quadrature signals CK_0 and CK_90 (cf. FIG. 2) the phase-shifted version of the sampling signal CK, represented by the signal components CK<1> to CK<8>.

The quadrature signals CK_0 and CK_90 are supplied to the interpolator 12 in differential form: The signal CK_0 consists of differential signal components CK_0_P and CK_0_N. The signal CK_90 consists of differential signal components CK_90_P and CK_90_N. The adjustment of the desired phase displacement takes place by means of the signal PHI<4:0>, in other words the signal transferred from the modulo-32 integrator 24 to the control input of the phase interpolator 12.

FIG. 7 shows the (identical) structure of the two interpolator halves 70-1 and 70-2 represented in FIG. 6. The structure of each interpolator half follows a design concept known per se, and comprises a digital-to-analog converter 74, which converts the PHI<4:0> signal supplied into an analog representation of current (symbolised by the current sources represented). The currents supplied from the current sources serve as adjusting currents for the respective transconductance stages, each of which as represented is formed from transistor pairs and effects a weighted superposition of the individual currents. The currents are fed via a common resistance load R, so that the potentials PH_OUTP und PH_OUTN indicated in FIG. 6 are provided as voltage drops across the resistance load R. The phase interpolator output signal corresponds to the weighted sum (formed by current superposition) of the CK1 and CK2 input signals, which always possess a phase difference of 90°. The resolution of the phase interpolator output signal is specified as 50 ps.

In summary the improvement achieved with the circuit arrangement according to FIG. 2, compared with the conventional phase detector according to FIG. 1, may once again be elucidated as follows:

The conventional phase detector of FIG. 1 can be structured as a sampler, which samples the input clock signal PD_IN with eight clock signals CK<1:8> (8 auxiliary sampling clock signal phases), each of which has a frequency of f=1.25 GHz. The clock signals CK<1:8> possess a mutual phase offset of 100 ps, so that the actual sampling rate is 8×1.25 GHz=10 GHz. For a sampling rate of 10 GHz a maximum sample-and-hold time of 100 ps is required for the flip-flops in the sampler. Using conventional CMOS flip-flops in a 0.13 μm CMOS technology this sampling rate of 10 GHz already exceeds the limits of this technology.

The form of embodiment represented in FIG. 2 enables the phase resolution to be improved below this 100 ps limit, for which purpose the "feedback path" represented for the sampler 14 has been provided. The feedback path runs from the output of the sampler 14 via the sign detector 20, and the modulo-32 integrator 24 back to the phase interpolator 12, which delivers one of the two input signals for the sampler 14. The new kind of phase detector PD comprises the sampler 14 of conventional kind, the additional digital sign integrator 22 in the forward path (to the adder 18) and the modulo-32 integrator 24 and the phase interpolator 12 in the feedback path.

The sampler 14 delivers the ten MSB bits as well as the sign information s to the sign integrator 22. The output of the sign integrator 22 and the output of the sampler 14, multiplied by 8, are added at the phase detector output (at the adder 18). In the feedback path the sign information (+/−1) is integrated by the modulo-32 integrator 24, and leads to a phase displacement of +/−12.5 ps (100 ps/8) of all eight sampling phases CK<1:8>. Thus the solution according to the invention improves the resolution of the phase detection from 100 ps to 12.5 ps and delivers three additional LSB bits at the output of the phase detector.

The bandwidth BW of the phase detector feedback loop with the phase interpolator can be approximately calculated as follows:

$$BW = dT \times (F0)^2 / JITTERp\text{-}p$$

where dT denotes the phase displacement at the interpolator output (e.g. 12.5 ps) ensuing for 1 LSB, F0 denotes the frequency of the input clock signal PD_IN (e.g. 19.44 MHz), and JITTERp-p denotes the peak-to-peak input jitter amplitude.

For the values given for dT and F0 in the example of embodiment, and for an input jitter of 0.4 (measured in "unit intervals" or "UI"), this approximation delivers a bandwidth BW of 11.8 kHz.

FIGS. 8 to 10 show some simulation results for a sinusoidal input jitter with various jitter frequencies and a jitter amplitude of 0.2 UI.

In these figures the output signals of the sign integrator 22, the sampler 14 (together with the amplifier 16) and the adder 18 are represented, denoted by "Sign Integrator", "Sampler" and "Pd-out" respectively, for jitter frequencies of 30 KHz (FIG. 8), 9 KHz (FIG. 9) and 1 KHz (FIG. 10). In all three cases the output signal from the adder "Pd-out", i.e. the signal denoted above as phase detection signal PD_OUT, ensues (as a result of the addition in the adder 18) as the sum of the output signals on the one hand from the sign integrator 22 (OUT2) and on the other hand from the sampling device 14 (OUT1).

From the simulation results it can be seen that in all three cases the phase detection signal reproduces the sinusoidal jitter well. The difference between the signal characteristics ensuing for the different jitter frequencies consists simply in the fact that the composition of the phase detection signal from the two additive superimposed signal components varies with the frequency. At the comparatively high jitter frequency of 30 kHz (FIG. 8) the phase detection signal is formed for the most part from the output signal of the sampling device 14, whereas with reducing jitter frequency (e.g. FIG. 9) the component of the output signal from the sign integrator 22 increases. At the comparatively low jitter frequency of 1 kHz (FIG. 10) the jitter is essentially registered and reproduced by the output signal of the sign integrator 22.

The invention claimed is:

1. A digital phase detector for the generation of a digital phase detection signal (PD_OUT), which specifies the phasing of an input clock signal (PD_IN) supplied to the phase detector with reference to a higher frequency sampling clock signal (CK_0, CK_90) supplied to the phase detector, comprising:
   a digital adjustable phase displacement device (12) for the generation of an auxiliary sampling clock signal (CK<1: 8>) as a digital adjusted phase displaced version of the sampling clock signal (CK_0, CK_90), wherein the auxiliary sampling clock signal (CK<1:8>) is adjustable in steps which in each case are smaller than one period of the sampling clock signal (CK_0, CK_90),
   a sampling device (14) for the sampling of the input clock signal (PD_IN) with the auxiliary sampling clock signal (CK<1:8>), in order to generate a first, more significant digital component (OUT1 <9:0>) of the phase detection signal (PD_OUT),
   an evaluation device (20, 22) for the evaluation of the first digital component (OUT1<9:0>) and for the generation of a digital control signal (s) on the basis of the evaluation result, by means of which the adjustable phase displacement device (12) is adjusted, and a second, less significant digital component (OUT2<12:0>) of the phase detection signal (PD_OUT) is generated,
   an adding device (18) for the generation of the phase detection signal (PD OUT) by an addition of the first and second digital components (OUT1<9:0>, OUT2<12: 0>) inputted to the adding device (18).

2. The phase detector according to claim 1, wherein the frequency of the sampling clock signal (CK_0, CK_90) is greater by at least a factor $10^1$, than the frequency anticipated for the input clock signal (PD_IN).

3. The phase detector according to claim 1, wherein the auxiliary sampling clock signal (CK<1:8>) is provided with a plurality of phases (CK<1>, CK<2>, . . . ) in order to increase the phase resolution in the generation of the first digital component (PD_OUT<9:0>).

4. The phase detector according to claim 3, wherein the plurality of auxiliary sampling clock signal phases (CK<1>, CK<2>, . . . ) are equidistant from one another.

5. The phase detector according to claim 4, wherein each adjustment step of the phase displacement corresponds to a whole number fraction of the phase difference between auxiliary sampling clock signal phases (CK<1>, CK<2>, . . . ) that are adjacent to each other.

6. The phase detector according to claim 1, wherein each adjustment step of the phase displacement corresponds to a whole number fraction of the sampling signal period.

7. The phase detector according to claim 1, wherein the sampling clock signal (CK_0, CK_90) is provided with a plurality of sampling phases and the phase displacement device (12) is designed as a phase interpolator for the digitally adjustable interpolation between the sampling phases (CK_0, CK_90).

8. The phase detector according to claim 1, wherein the adjustment of the phase displacement is prescribed by an output signal (PHI<4:0>) of a modulo-integrator (24), to which is inputted the digital control signal (s) generated by the evaluation device (20).

9. The phase detector according to claim 1, wherein the evaluation device (20, 22) comprises a sign detector (20) to determine a sign of the first digital component (OUT1<9:0>).

10. A method for the generation of a digital phase detection signal (PD_OUT), which specifies the phasing of an input clock signal (PD_IN) with reference to a higher frequency sampling clock signal (CK_0, CK_90), comprising the steps:
    generation of an auxiliary sampling clock signal (CK<1: 8>) as a digitally adjusted phase displaced version of the sampling clock signal (CK_0, CK_90), wherein the auxiliary sampling clock signal (CK<1:8>) is adjustable in steps which in each case are smaller than one period of the sampling clock signal (CK_0, CK_90),
    sampling of the input clock signal (PD_IN) with the auxiliary sampling clock signal (CK<1:8>), in order to generate a first, more significant digital component (OUT1<9:0>) of the phase detection signal (PD_OUT),
    evaluation of the first digital component (OUT1 <9:0>) and generation of a digital control signal (s) on the basis of the evaluation result, by means of which the adjustable phase displacement provided by the generation of the auxiliary sampling clock signal (CK<1:8>) is adjusted, and a second, less significant digital component (OUT2<12:0>) of the phase detection signal (PD_OUT) is generated,
    addition of the first and second digital components (OUT1<9:0>, OUT2<12:0>), in order to generate the digital phase detection signal (PD OUT).

\* \* \* \* \*